United States Patent

Arima et al.

(10) Patent No.: US 12,396,188 B2
(45) Date of Patent: Aug. 19, 2025

(54) SCHOTTKY BARRIER DIODE

(71) Applicant: TDK Corporation, Tokyo (JP)

(72) Inventors: Jun Arima, Tokyo (JP); Minoru Fujita, Tokyo (JP); Katsumi Kawasaki, Tokyo (JP); Jun Hirabayashi, Tokyo (JP)

(73) Assignee: TDK Corporation, Tokyo (JP)

(*) Notice: Subject to any disclaimer, the term of this patent is extended or adjusted under 35 U.S.C. 154(b) by 576 days.

(21) Appl. No.: 17/784,880

(22) PCT Filed: Oct. 5, 2020

(86) PCT No.: PCT/JP2020/037723
§ 371 (c)(1),
(2) Date: Jun. 13, 2022

(87) PCT Pub. No.: WO2021/124650
PCT Pub. Date: Jun. 24, 2021

(65) Prior Publication Data
US 2023/0039171 A1   Feb. 9, 2023

(30) Foreign Application Priority Data
Dec. 18, 2019 (JP) .................. 2019-228556

(51) Int. Cl.
*H10D 8/60* (2025.01)
*H10D 62/80* (2025.01)
*H10D 99/00* (2025.01)

(52) U.S. Cl.
CPC ............ *H10D 8/605* (2025.01); *H10D 62/80* (2025.01); *H10D 99/00* (2025.01)

(58) Field of Classification Search
CPC . H01L 29/872; H01L 29/8725; H01L 23/291; H01L 23/3178; H01L 23/3171;
(Continued)

(56) References Cited

U.S. PATENT DOCUMENTS

| 2012/0122307 A1 | 5/2012 | Mizushima |
| 2013/0168765 A1 | 7/2013 | Lin et al. |

(Continued)

FOREIGN PATENT DOCUMENTS

| JP | 2016-181581 A | 10/2016 |
| JP | 2017-199869 A | 11/2017 |

(Continued)

OTHER PUBLICATIONS

International Search Report issued in corresponding International Patent Application No. PCT/JP2020/037723, dated Dec. 1, 2020, with English translation.

(Continued)

*Primary Examiner* — Cheung Lee
(74) *Attorney, Agent, or Firm* — Rimon P.C.

(57) ABSTRACT

A Schottky barrier diode includes a semiconductor substrate made of gallium oxide, a drift layer made of gallium oxide and formed on the semiconductor substrate, an anode electrode brought into Schottky contact with the drift layer, a cathode electrode brought into ohmic contact with the semiconductor substrate, an insulating film covering the inner wall of a trench formed in the drift layer, and a protective film covering the anode electrode, wherein a part of the protective film is embedded in the trench. The part of the protective film is thus embedded in the trench, so that adhesion performance between the anode electrode and protective film is enhanced. This makes it possible to prevent peeling at the boundary between the anode electrode and the protective film.

6 Claims, 18 Drawing Sheets

(58) Field of Classification Search
CPC ........ H01L 29/407; H10D 8/60; H10D 8/605; H10D 62/80; H10D 64/117; H10D 64/23; H10D 64/232; H10D 99/00
See application file for complete search history.

(56) References Cited

U.S. PATENT DOCUMENTS

2015/0333190 A1   11/2015   Aketa et al.
2019/0148563 A1   5/2019   Sasaki et al.
2020/0127099 A1   4/2020   Hayashida et al.
2021/0119062 A1   4/2021   Arima et al.
2021/0167225 A1   6/2021   Arima et al.

FOREIGN PATENT DOCUMENTS

| JP | 2019-079984 A | 5/2019 | |
|---|---|---|---|
| TW | 201942976 A | 11/2019 | |
| WO | 2014/091961 A1 | 6/2014 | |
| WO | WO-2018146791 A1 * | 8/2018 | ......... H01L 29/0619 |
| WO | WO-2019082580 A1 * | 5/2019 | ......... H01L 29/0611 |

OTHER PUBLICATIONS

Extended European Search Report issued for the corresponding European patent Application No. 20903205.1 on Dec. 1, 2023.

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2020/037723, filed on Oct. 5, 2020, which claims the benefit of Japanese Patent Application No. 2019-228556, filed on Dec. 18, 2019, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (about 8 MV/cm), so that a Schottky barrier diode using gallium oxide is very promising as the switching element for a power device. An example of the Schottky barrier diode using gallium oxide is described in Patent Documents 1 and 2.

In Schottky barrier diodes described in Patent Documents 1 and 2, a plurality of trenches are provided in a gallium oxide layer. With the above structure, where the plurality of trenches are formed in the gallium oxide layer, when a reverse voltage is applied, a mesa region positioned between adjacent trenches becomes a depletion layer, so that a channel region of a drift layer is pinched off. Thus, a leak current upon application of the reverse voltage can be significantly reduced.

CITATION LIST

Patent Document

[Patent Document 1] JP 2017-199869A
[Patent Document 2] JP 2019-079984A

SUMMARY OF THE INVENTION

Problem to be Solved by the Invention

In an actual device, a protective film is formed on an anode electrode to thereby provide electrical insulation from external circuits. However, adhesion performance between a metal anode electrode and a protective film made of SiN or the like is low, so that peeling is likely to occur at the interface therebetween.

It is therefore an object of the present invention to prevent, in a Schottky barrier diode using gallium oxide, peeling at the interface between an anode electrode and a protective film.

Means for Solving the Problem

A Schottky barrier diode according to the present invention includes: a semiconductor substrate made of gallium oxide; a drift layer made of gallium oxide and formed on the semiconductor substrate; an anode electrode brought into Schottky contact with the drift layer; a cathode electrode brought into ohmic contact with the semiconductor substrate; an insulating film covering the inner wall of a trench formed in the drift layer; and a protective film covering the anode electrode, wherein a part of the protective film is embedded in the trench.

According to the present invention, a part of the protective film is embedded in the trench, thus enhancing adhesion performance between the anode electrode and the protective film. This makes it possible to prevent peeling at the interface between the anode electrode and the protective film.

In the present invention, the trench may be formed in a ring shape and filled with a part of the protective film and a metal member electrically connected to the anode electrode. Thus, the presence of the ring-shaped trench allows an electric field applied to the drift layer to be relaxed.

The trench may have a flat side wall part, and the boundary between the protective film and the metal member may terminate at the side wall part. Further, the trench may have a flat bottom surface part, and the boundary between the protective film and the metal member may terminate at the bottom surface part. This makes it possible to relax an electric field applied to the drift layer in the vicinity of the end position of the metal member.

Advantageous Effects of the Invention

As described above, according to the present invention, it is possible to prevent, in a Schottky barrier diode using gallium oxide, peeling at the interface between the anode electrode and the protective film.

MODE FOR CARRYING OUT THE INVENTION

Preferred embodiments of the present invention will be explained below in detail with reference to the accompanying drawings.

First Embodiment

Figure 1:
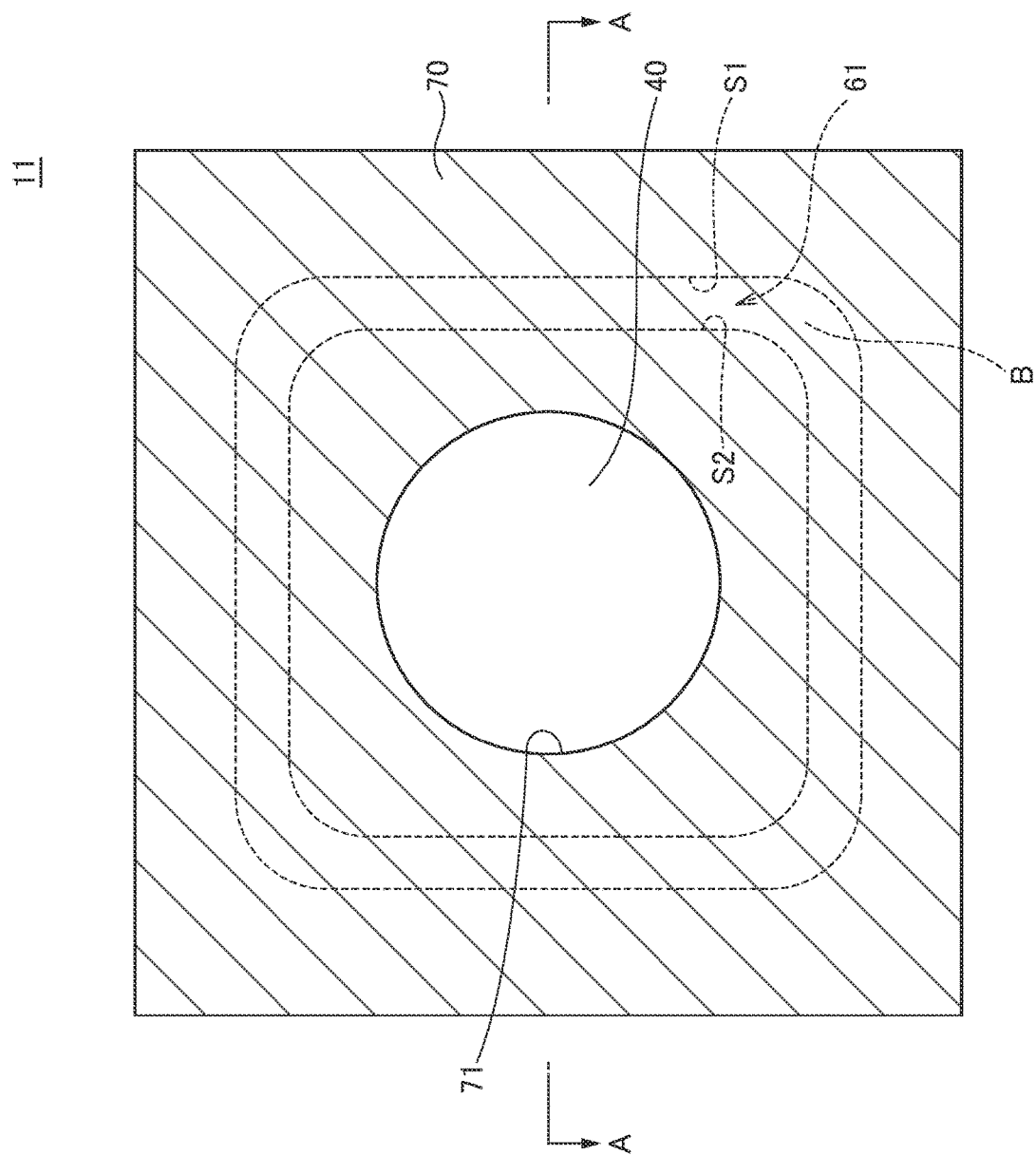
FIG. 1 is a schematic plan view illustrating the configuration of a Schottky barrier diode 11 according to a first embodiment of the present invention.
Figure 2:
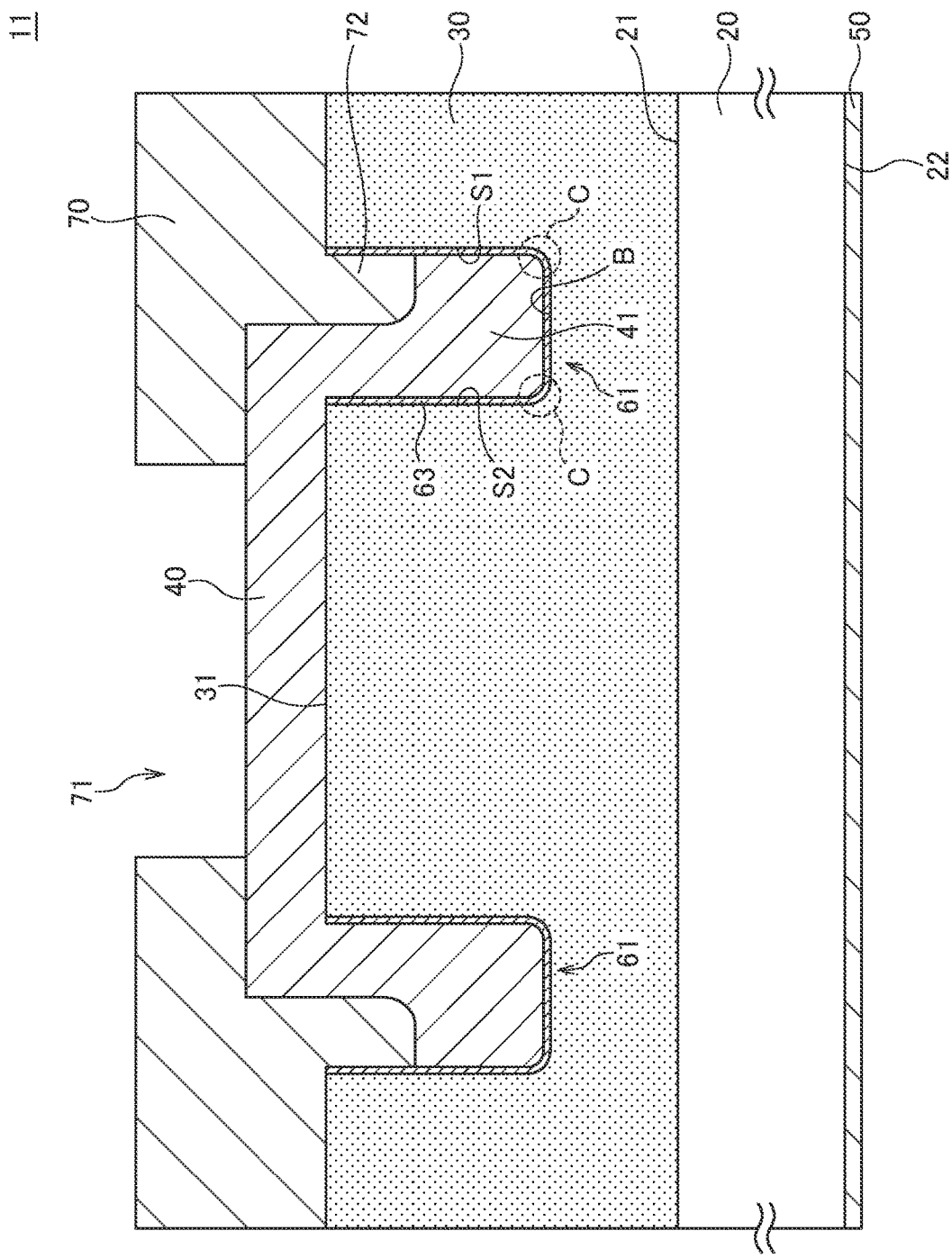
FIG. 2 is a schematic cross-sectional view taken along line A-A in FIG. 1.

FIG. 1 is a schematic plan view illustrating the configuration of a Schottky barrier diode 11 according to a first embodiment of the present invention. FIG. 2 is a schematic cross-sectional view taken along line A-A in FIG. 1.

As illustrated in FIGS. 1 and 2, the Schottky barrier diode 11 according to the present embodiment has a semiconductor substrate 20 and a drift layer 30, both of which are made of gallium oxide ($\beta$-$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness thereof is about 250 μm. Although there is no particular restriction on the planar size of the semiconductor substrate 20, the planar size is generally selected in accordance with the amount of current flowing in the element and, when the maximum amount of forward current is about 20 A, the size may be set to about 2.4 mm×2.4 mm in a plan view.

The semiconductor substrate 20 in a mounted state has an upper surface 21 positioned on its upper surface side and a back surface 22 positioned on its lower surface side (opposite to the upper surface side 21). The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 μm.

An anode electrode 40, which is brought into Schottky contact with the drift layer 30, is formed on an upper surface 31 of the drift layer 30. The anode electrode 40 is formed of metal such as platinum (Pt), palladium (Pd), gold (Au), nickel (Ni), molybdenum (Mo), Cupper (Cu), or the like. The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50, which is brought into ohmic contact with the semiconductor substrate 20, is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

In the present embodiment, an outer peripheral trench 61 having a ring shape is formed in the drift layer 30. The inner wall of the outer peripheral trench 61 includes a side wall part S1 positioned outside, a side wall part S2 positioned inside, and a bottom surface part B. In the present embodiment, the side wall parts S1, S2 and bottom surface part B are flat, and a corner part C positioned at the boundary between the side wall part S1 or side wall part S2 and the bottom surface part B has a curved shape. The inner wall of the outer peripheral trench 61 is covered with an insulating film 63 made of $HfO_2$ or the like. Aside from $HfO_2$, an insulating material such as $Al_2O_3$ can be used as the material of the insulating film 63. The outer peripheral trench 61 is mostly filled with a metal member 41. The material of the metal member 41 may be the same as that of the anode electrode 40 (that is, the metal member 41 may be a part of the anode electrode 40) or may be different therefrom.

The outer peripheral portion of the anode electrode 40 is covered with a protective film 70. The protective film 70 is made of a resin material such as epoxy resin, acrylic resin (polymethyl metacrylate, etc.), polyurethane, polyimide, polyvinyl alcohol, fluororesin, or polyolefin, or an inorganic insulating material including an inorganic oxide or nitride film, such as silicon oxide, aluminum oxide, or silicon nitride. The protective film 70 has an opening 71 exposing the center portion of the anode electrode 40 to which a bonding wire or the like is to be connected. The protective film 70 protects the anode electrode 40 and provides electrical insulation from the external circuits.

As illustrated in FIG. 2, in the Schottky barrier diode 11 according to the present embodiment, a part 72 of the protective film 70 is embedded in the outer peripheral trench 61. Adhesion performance between the metal anode electrode 40 and the protective film 70 made of SiN or the like is low, so that peeling is likely to occur at the interface therebetween; however, in the present embodiment, the part 72 of the protective film 70 is embedded in the outer peripheral trench 61, so that performance is enhanced as compared to a case where the anode electrode 40 and the protective film 70 contact each other in one dimensional manner. This makes it possible to prevent peeling at the interface between the anode electrode 40 and the protective film 70.

Further, in the present embodiment, the boundary between the part 72 of the protective film 70 and the metal member 41, both embedded in the outer peripheral trench 61, contact the insulating film 63 on the outer side wall part S1. As described above, the side wall part S1 is flat, and accordingly the boundary between the protective film 70 and the metal member 41, i.e., the end portion of the metal member 41 terminates at a flat surface. Thus, as compared to a case where the metal member 41 terminates at a surface having a curved shape, such as the corner part C, an electric field applied to the drift layer 30 in the vicinity of the end portion of the metal member 41 can be relaxed.

The following describes a manufacturing method for the Schottky barrier diode 11 according to the present embodiment.

FIGS. 3 to 8 are process views for explaining the manufacturing method for the Schottky barrier diode 11 according to the present embodiment, each of which corresponds to the cross section illustrated in FIG. 2.

Figure 3:
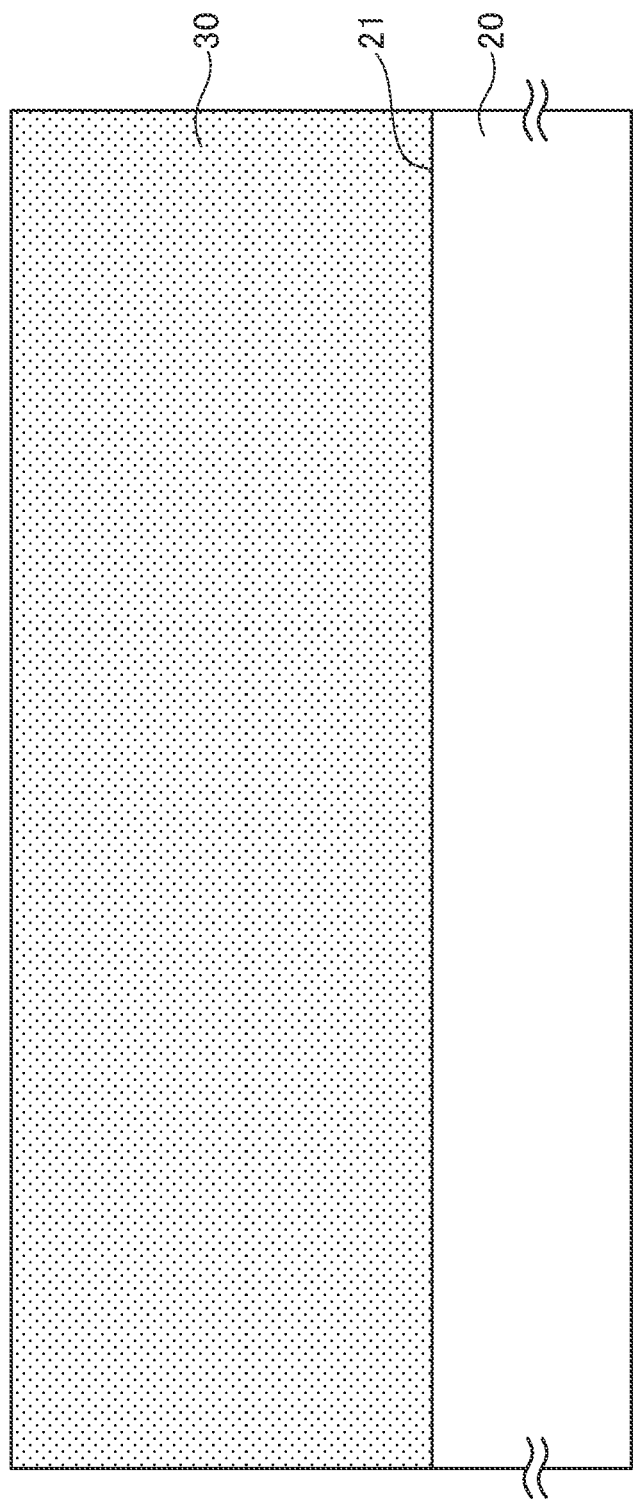
FIG. 3 is a process view for explaining the manufacturing method for the Schottky barrier diode 11.

First, as illustrated in FIG. 3, the semiconductor substrate 20 made of gallium oxide is prepared, and then the drift layer 30 made of gallium oxide is formed on the upper surface 21 of the semiconductor substrate 20. As described above, the drift layer 30 can be formed by epitaxially growing gallium oxide on the upper surface 21 of the semiconductor substrate 20 using a reactive sputtering method, a PLD method, an MBE method, an MOCVD method, or an HVPE method.

Figure 4:
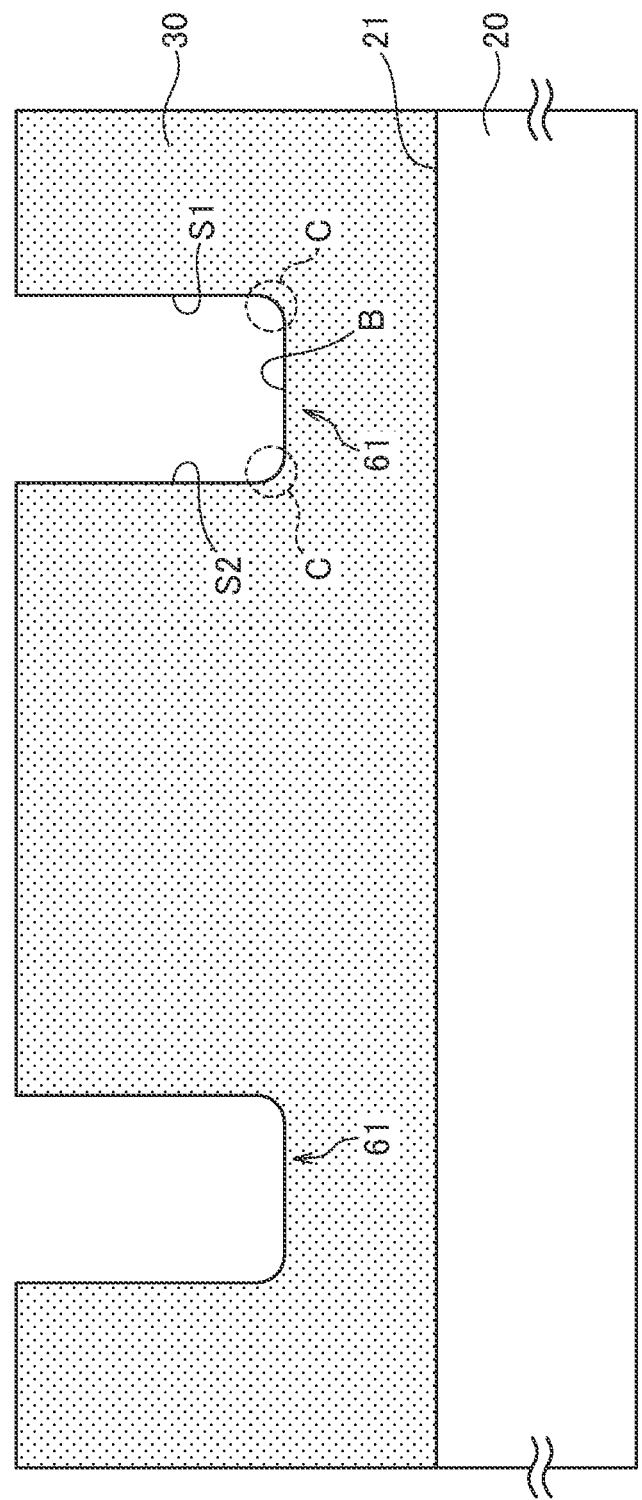
FIG. 4 is a process view for explaining the manufacturing method for the Schottky barrier diode 11.

Then, as illustrated in FIG. 4, dry-etching using $BCl_3$ or the like is performed to form the ring-shaped outer peripheral trench 61 in the drift layer 30. Etching conditions are set such that at least the side wall parts S1 and S2 each become a substantially vertical flat surface. Preferably, the bottom surface part B is also made to be a substantially vertical fat surface.

Figure 5:
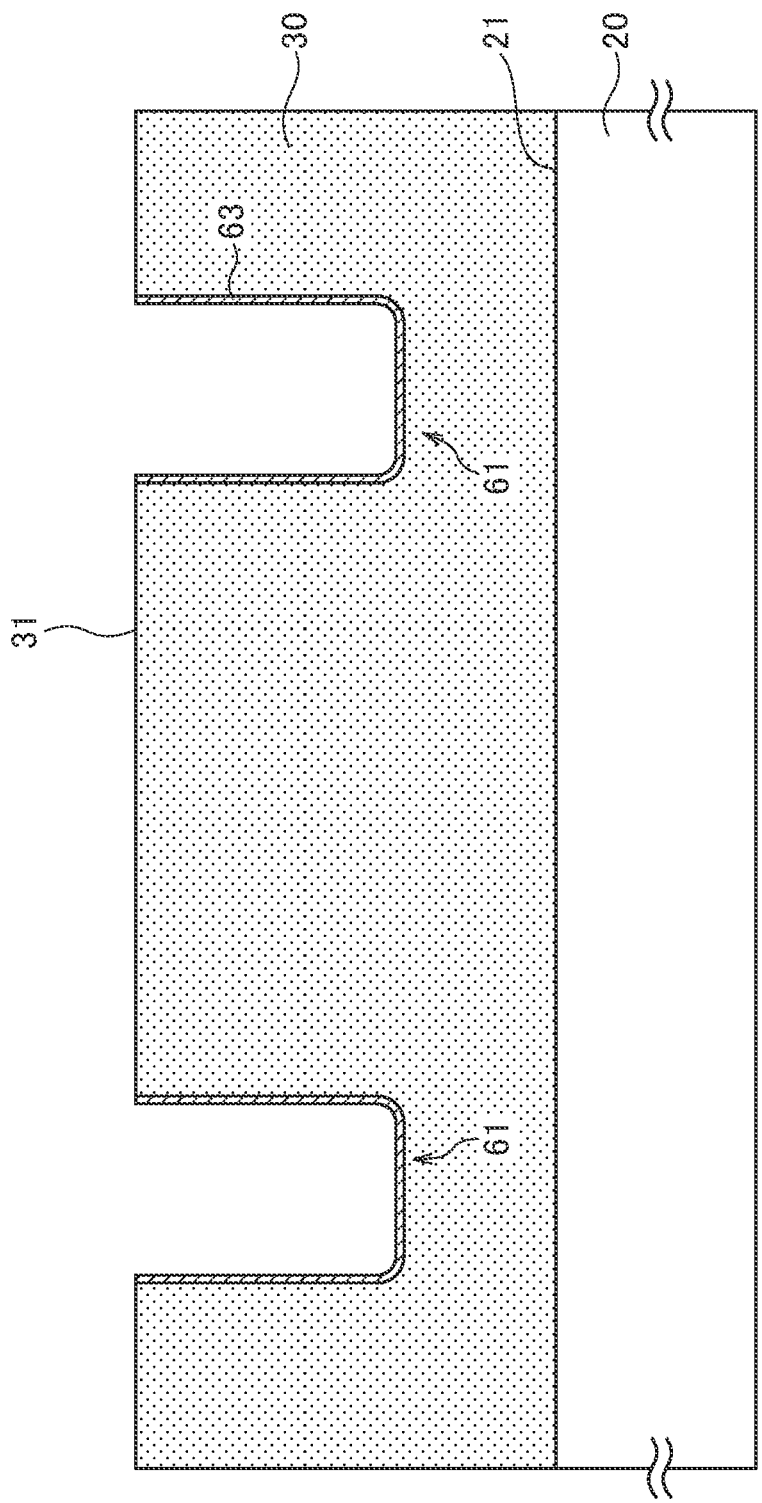
FIG. 5 is a process view for explaining the manufacturing method for the Schottky barrier diode 11.

Subsequently, as illustrated in FIG. 5, the insulating film 63 is formed on the surface of the drift layer 30. The insulating film 63 can be formed using a commonly known film forming method such as an ALD method. Thereafter, the insulating film 63 formed on the upper surface 31 of the drift layer 30 is removed by commonly known treatment such as wet-etching, dry-etching, or CMP. As a result, the upper surface 31 of the drift layer 30 is exposed, and the inner wall of the outer peripheral trench 61 is covered with the insulating film 63. At this time, the upper surface 31 of the drift layer 30 may be removed partly.

Figure 6:
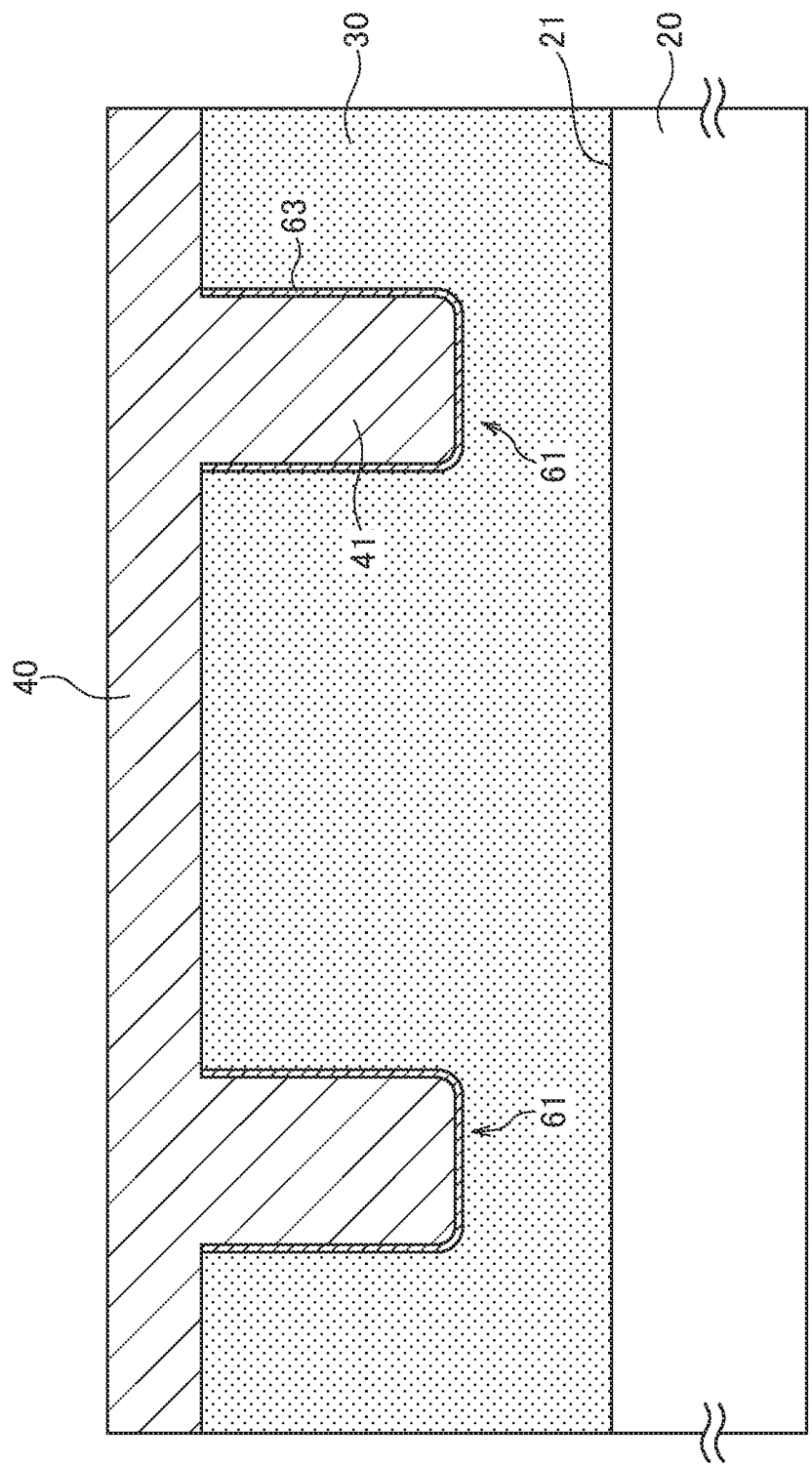
FIG. 6 is a process view for explaining the manufacturing method for the Schottky barrier diode 11.

Then, as illustrated in FIG. 6, the anode electrode 40 is formed on the entire surface. The metal member 41 to be filled in the outer peripheral trench 61 may be made of a material different from the material of the anode electrode 40. In this case, the anode electrode 40 may be formed before the metal member 41 made of a material different from that of the anode electrode 40 is filled in the outer peripheral trench 61, or the metal member 41 made of a material different from that of the anode electrode 40 may be first filled in the outer peripheral trench 61 as long as the different material does not remain on the surface 31 of the drift layer 30. With this configuration, the metal member 41 embedded in the outer peripheral trench 61 is electrically connected to the anode electrode 40 and hence has the same potential as the anode electrode 40.

Figure 7:
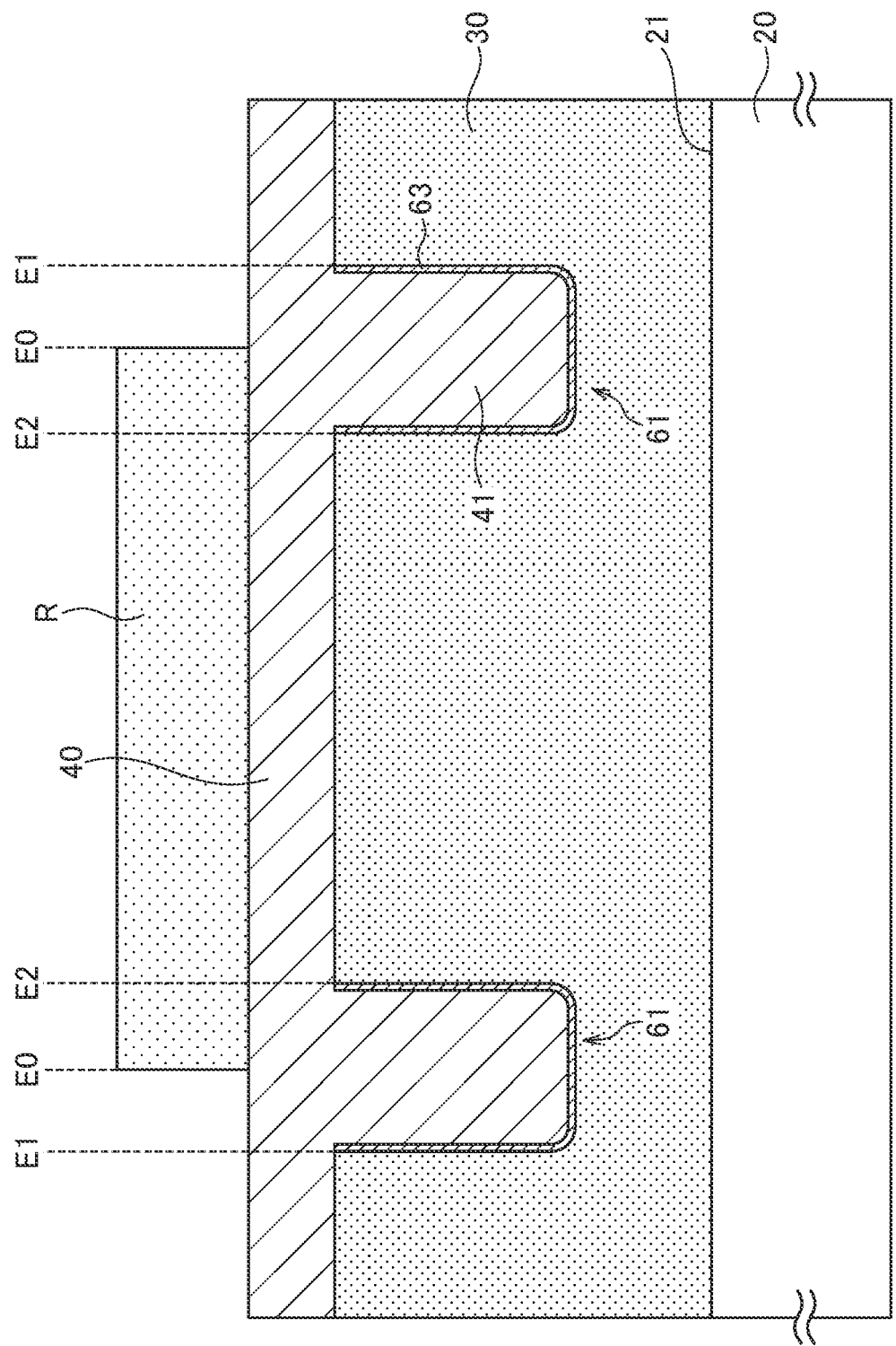
FIG. 7 is a process view for explaining the manufacturing method for the Schottky barrier diode 11.

Then, as illustrated in FIG. 7, a resist R is formed so as to cover the center portion of the anode electrode 40 and expose the outer peripheral portion thereof. The resist R can be patterned by a photolithography method. An outer edge E0 of the resist R is designed so as to be positioned between an outer edge E1 of the outer peripheral trench 61 and an inner edge E2 of the outer peripheral trench 61. That is, the outer diameter of the resist R is made smaller than the outer diameter of the outer peripheral trench 61 and larger than the inner diameter of the outer peripheral trench 61 such that the outer edge E0 of the resist R is positioned inside the outer peripheral trench 61.

Figure 8:
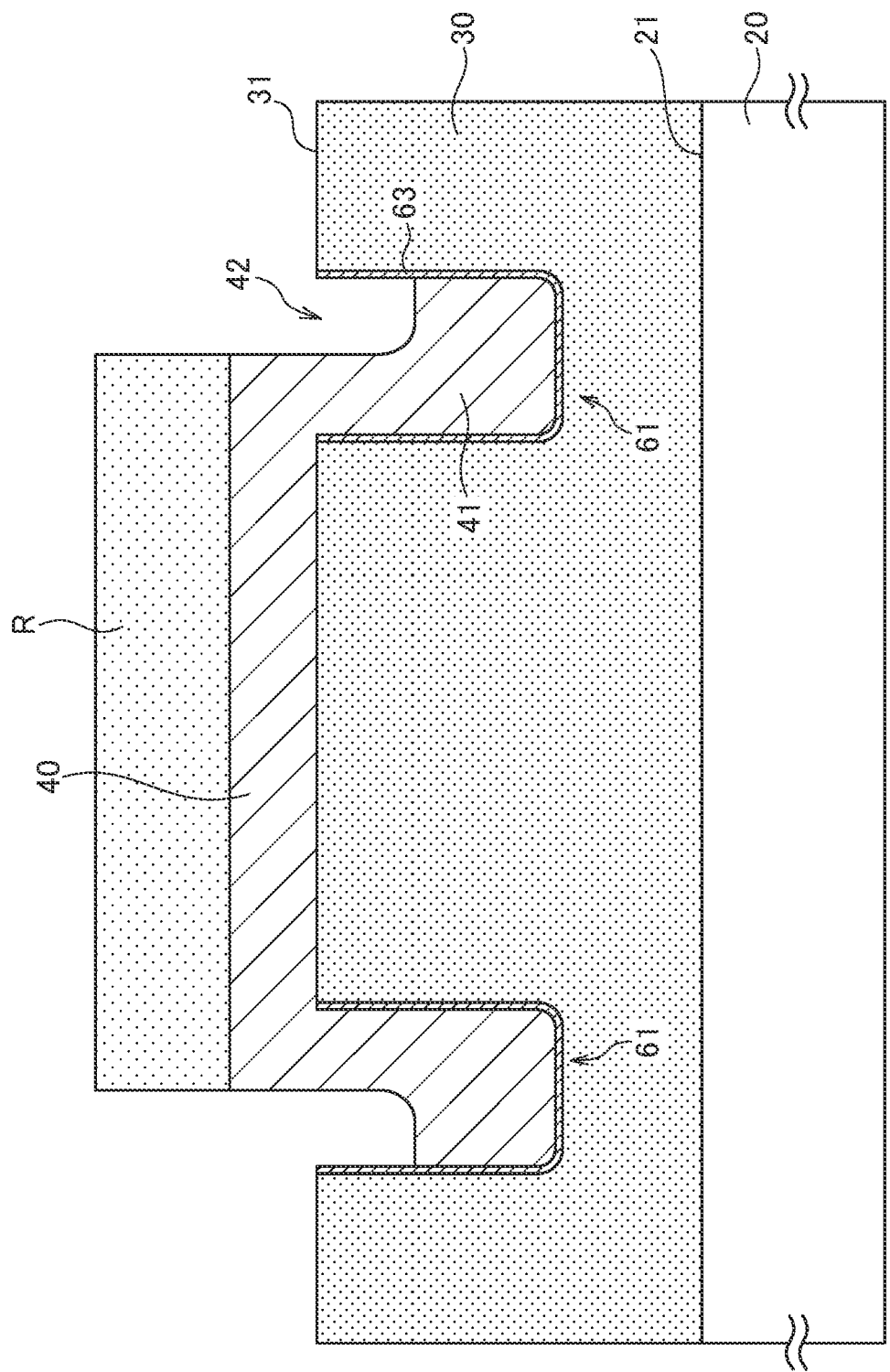
FIG. 8 is a process view for explaining the manufacturing method for the Schottky barrier diode 11.

Then, as illustrated in FIG. 8, the anode electrode 40 is etched with the resist R as a mask. In the etching process of the anode electrode 40, after the upper surface 31 of the drift layer 30 is exposed by the etching, over-etching is performed to partly remove a part of the metal member 41 that is embedded in the outer peripheral trench 61, to thereby forming a cavity 42. Thereafter, the resist R is removed.

Then, the cathode electrode 50 is formed on the back surface 22 of the semiconductor substrate 20, and the protective film 70 is formed so as to cover the anode electrode 40, whereby the part 72 of the protective film 70 is embedded in the cavity 42. When a resin material is used as the material of the protective film 70, there are available methods of: applying and drying a resin solution to obtain a resin film; applying or vapor-depositing a resin monomer, followed by polymerization; and applying crosslinking treatment after film formation. When an inorganic insulating material is used as the material of the protective film 70, a vacuum process such as a sputtering or vapor-deposition method, or a solution process such as a sol-gel method may be used. Thus, the Schottky barrier diode 11 according to the present embodiment is completed.

As described above, in the Schottky barrier diode 11 according to the present embodiment, the part 72 of the protective film 70 is embedded in the outer peripheral trench 61, thus enhancing adhesion performance between the anode electrode 40 and the protective film 70. This makes it possible to prevent peeling at the interface between the anode electrode 40 and the protective film 70.

Second Embodiment

Figure 9:
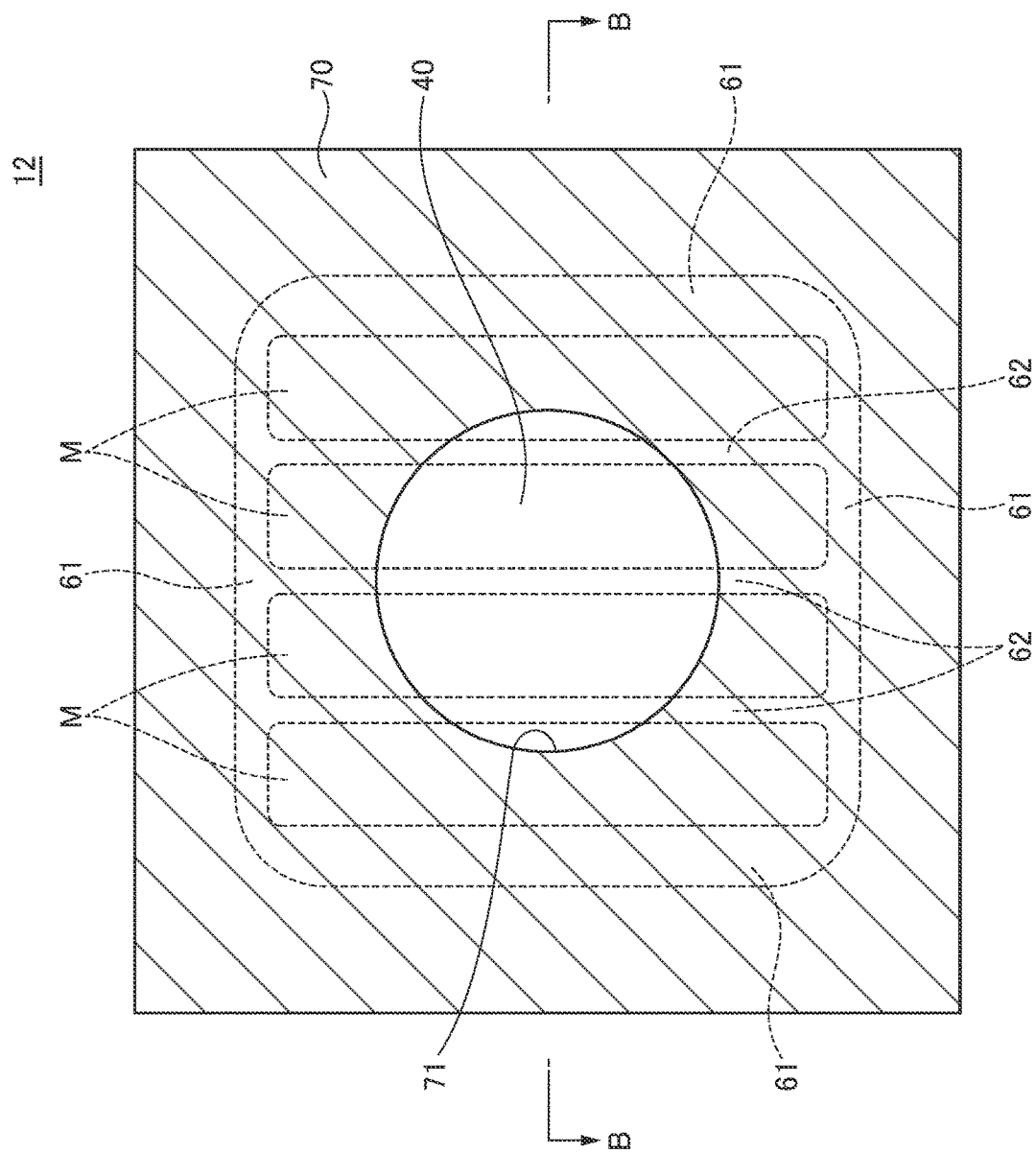
FIG. 9 is a schematic plan view illustrating the configuration of a Schottky barrier diode 12 according to a second embodiment of the present invention.
Figure 10:
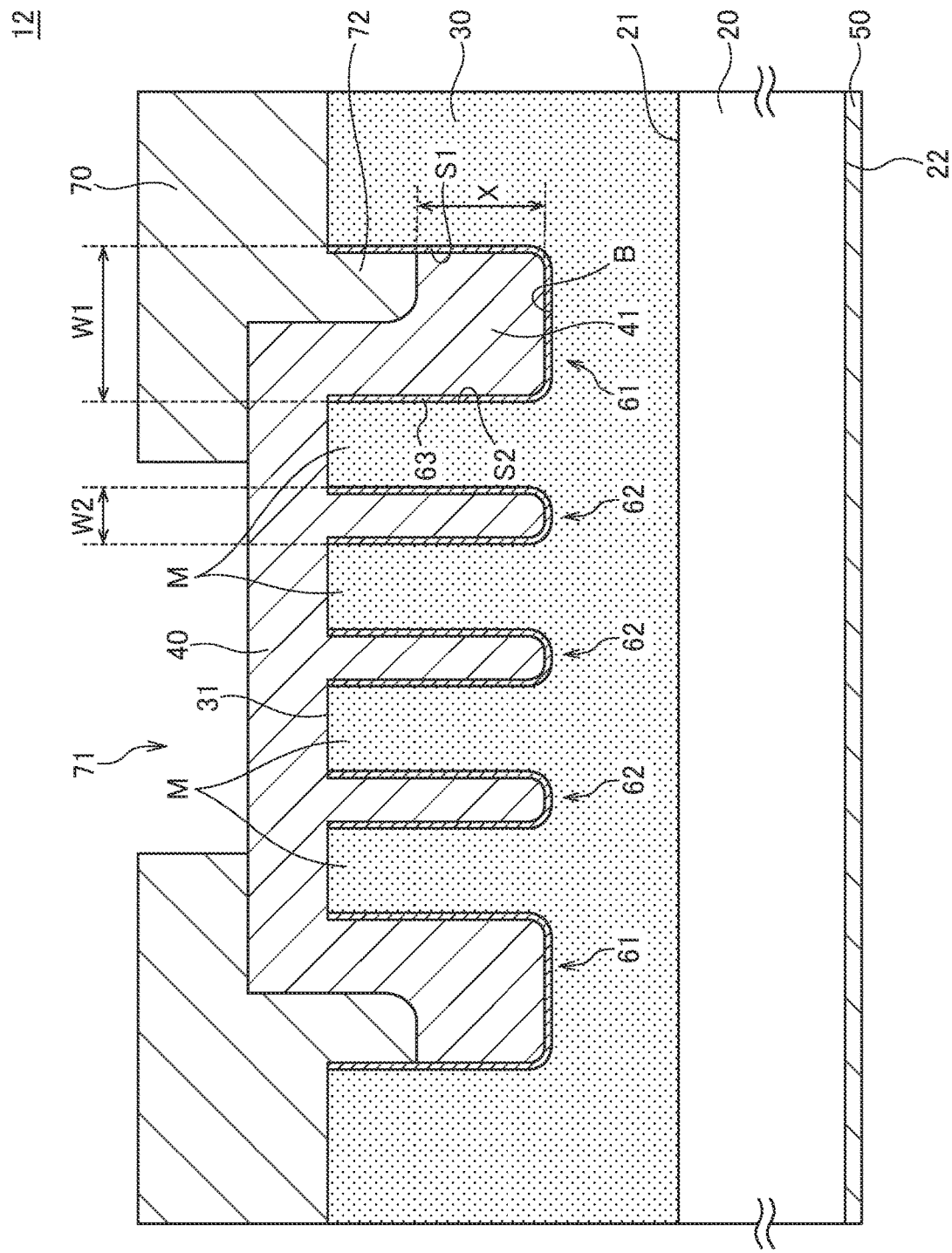
FIG. 10 is a schematic cross-sectional view taken along line B-B in FIG. 9.

FIG. 9 is a schematic plan view illustrating the configuration of a Schottky barrier diode 12 according to a second embodiment of the present invention. FIG. 10 is a schematic cross-sectional view taken along the line B-B in FIG. 9.

As illustrated in FIGS. 9 and 10, the Schottky barrier diode 12 according to the second embodiment differs from the Schottky barrier diode 11 according to the first embodiment in that a plurality of center tranches 62 are formed in the drift layer 30. Other basic configurations are the same as those of the Schottky barrier diode 11 according to the first embodiment, so the same reference numerals are given to the same elements, and overlapping description will be omitted.

The center trenches 62 are formed in an area surrounded by the outer peripheral trench 61 so as to overlap the anode electrode 40 in a plan view. The outer peripheral trench 61 and center trenches 62 need not be completely separated from each other and may be connected to each other as illustrated in FIG. 9.

A part of the drift layer 30 that is defined by the trenches 61 and 62 constitutes a mesa region M. The mesa region M becomes a depletion layer when a reverse voltage is applied between the anode electrode 40 and the cathode electrode 50, so that a channel region of the drift layer 30 is pinched off. Thus, a leak current upon application of the reverse voltage can be significantly reduced.

Although not particularly limited, assuming that the widths of the outer peripheral trench 61 and center trench 62 are W1 and W2, respectively, W1>W2 is satisfied in the present embodiment. This is to prevent dielectric breakdown at the bottom portion of the outer peripheral trench 61 on which an electric field concentrates particularly. That is, an increase in the width W1 of the outer peripheral trench 61 increases the distance between the two corner parts C when the outer peripheral trench 61 is viewed in the cross section. This makes it less likely to cause dielectric breakdown in the vicinity of the bottom portion of the outer peripheral trench 61. The depth of the outer peripheral trench 61 and that of the center trench 62 are the same.

In the present embodiment as well, the part 72 of the protective film 70 is embedded in the outer peripheral trench 61, thus enhancing adhesion performance between the anode electrode 40 and the protective film 70. As exemplified by the present embodiment, when the outer peripheral and center trenches 61 and 62 are formed in the drift layer 30, it is possible to prevent peeling of the protective film 70 by embedding the part 72 of the protective film 70 in the outer peripheral trench 61.

Third Embodiment

Figure 11:
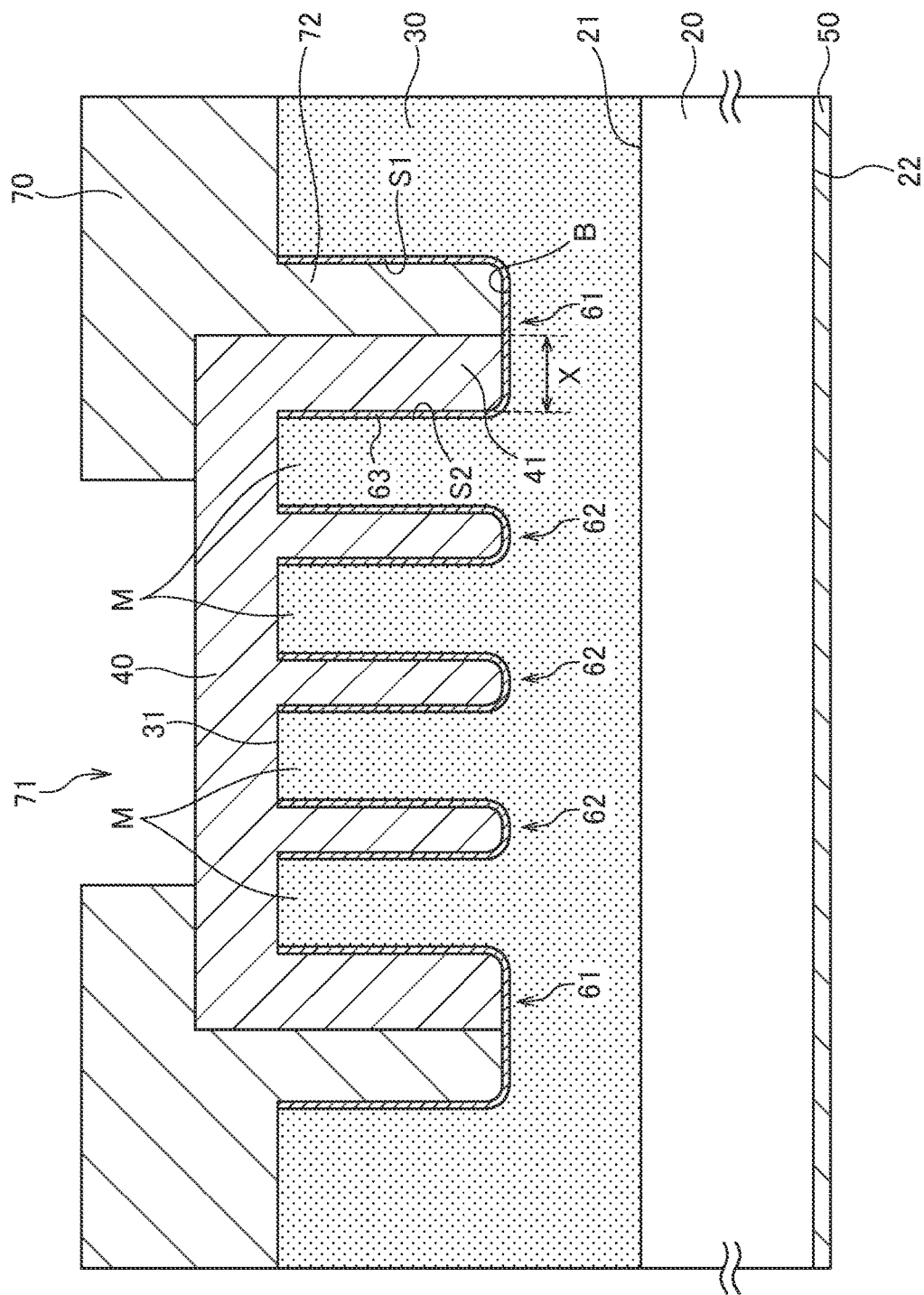
FIG. 11 is a schematic plan view illustrating the configuration of a Schottky barrier diode 13 according to a third embodiment of the present invention.

FIG. 11 is a schematic cross-sectional view illustrating the configuration of a Schottky barrier diode 13 according to a third embodiment of the present invention.

As illustrated in FIG. 11, the Schottky barrier diode 13 according to the third embodiment differs from the Schottky barrier diode 12 according to the second embodiment in that the boundary between the part 72 of the protective film 70 and the metal member 41 reaches the bottom surface part B of the outer peripheral trench 61 in which they are embedded. Other basic configurations are the same as those of the Schottky barrier diode 12 according to the second embodiment, so the same reference numerals are given to the same elements, and overlapping description will be omitted.

In the present embodiment, the part 72 of the protective film 70 is embedded deeper in the outer peripheral trench 61, and the bottom portion of the part 72 contacts the insulating film 63 covering the bottom surface part B, thus making it possible to prevent peeling of the protective film 70 more effectively. Further, as described above, the bottom surface part B is flat, and accordingly the boundary between the protective film 70 and metal member 41, i.e., the end portion of the metal member 41 terminates at a flat surface. Thus, as compared to a case where the metal member 41 terminates at a surface having a curved shape, such as the corner part C, an electric field applied to the drift layer 30 in the vicinity of the end portion of the metal member 41 can be relaxed.

Fourth Embodiment

Figure 12:
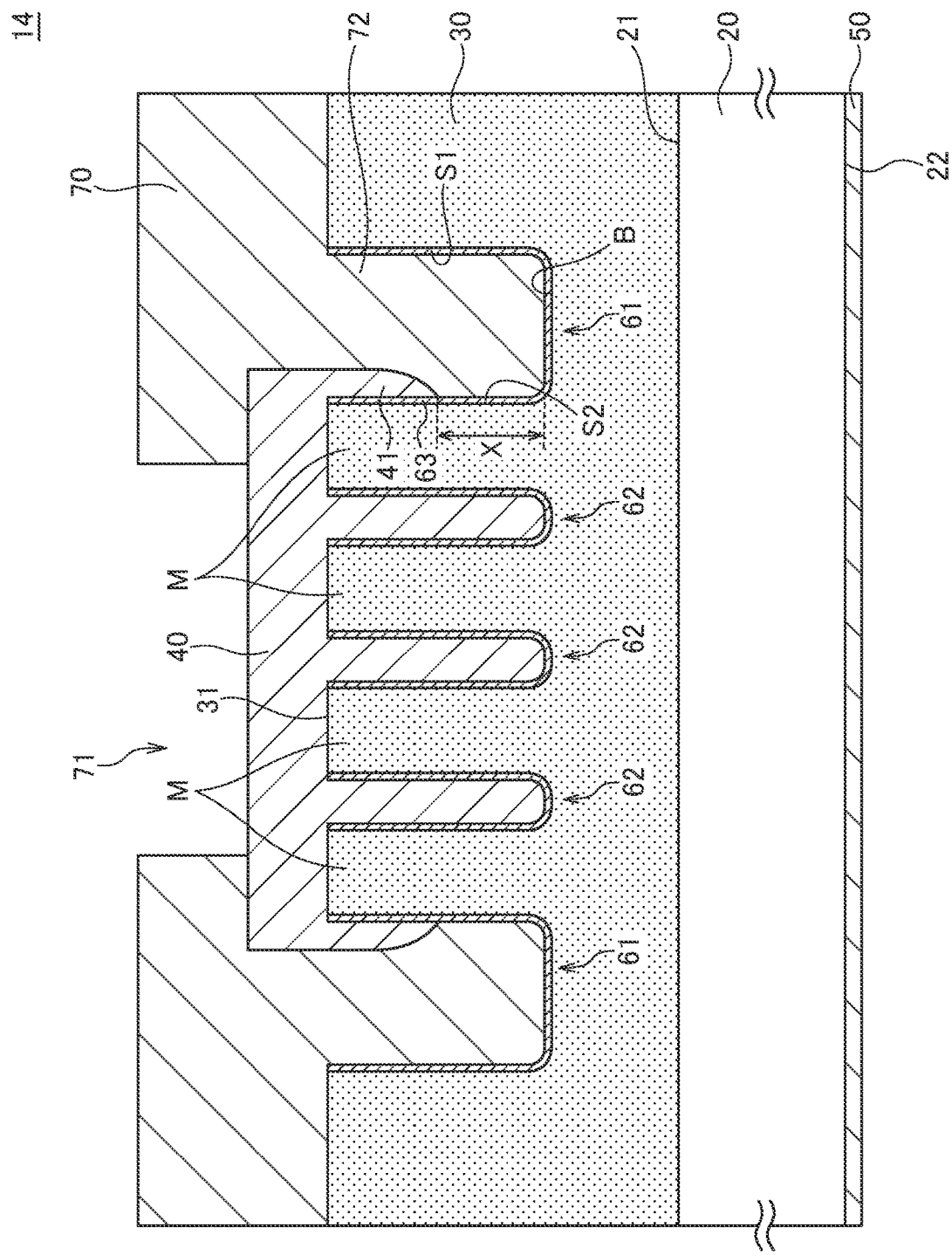
FIG. 12 is a schematic plan view illustrating the configuration of a Schottky barrier diode 14 according to a fourth embodiment of the present invention.

FIG. 12 is a schematic cross-sectional view illustrating the configuration of a Schottky barrier diode 14 according to a fourth embodiment of the present invention.

As illustrated in FIG. 12, the Schottky barrier diode 14 according to the fourth embodiment differs from the Schottky barrier diode 12 according to the second embodiment in that the boundary between the part 72 of the protective film 70 and the metal member 41 terminates at the inner side wall part S2 of the outer peripheral trench 61 in which they are embedded. Other basic configurations are the same as those of the Schottky barrier diode 12 according to the second embodiment, so the same reference numerals are given to the same elements, and overlapping description will be omitted.

In the present embodiment, the part 72 of the protective film 70 is embedded deeper in the outer peripheral trench 61, and the bottom portion of the part 72 contacts the insulating film 63 covering the side wall part S2, thus making it possible to prevent peeling of the protective film 70 more effectively. Further, the part 72 of the protective film 70 is shaped so as to have a large diameter at the bottom portion of the outer peripheral trench 61 and a small diameter at the entrance thereof, so that a so-called anchor effect is also expected. Furthermore, as described above, the side wall part S2 is flat, and accordingly the boundary between the protective film 70 and the metal member 41, i.e., the end portion of the metal member 41 terminates at a flat surface. Thus, as compared to a case where the metal member 41 terminates at a surface having a curved shape, such as the corner part C, an electric field to be applied to the drift layer 30 in the vicinity of the end portion of the metal member 41 can be relaxed.

Fifth Embodiment

Figure 13:
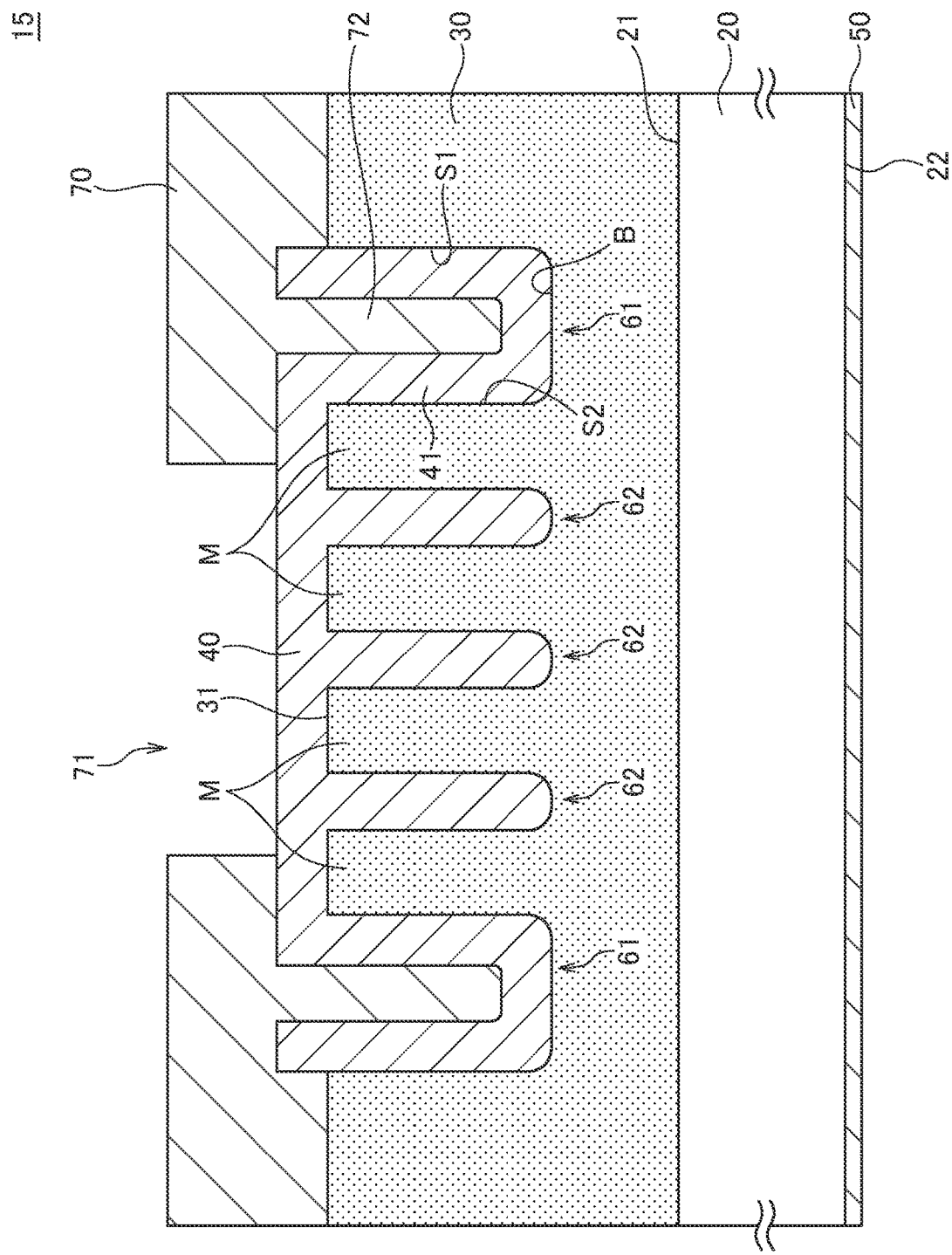
FIG. 13 is a schematic plan view illustrating the configuration of a Schottky barrier diode 15 according to a fifth embodiment of the present invention.

FIG. 13 is a schematic cross-sectional view illustrating the configuration of a Schottky barrier diode 15 according to a fifth embodiment of the present invention.

As illustrated in FIG. 13, the Schottky barrier diode 15 according to the fifth embodiment differs from the Schottky barrier diode 12 according to the second embodiment in that the part 72 of the protective film 70 embedded in the outer peripheral trench 61 does not contact the insulating film 63. Other basic configurations are the same as those of the Schottky barrier diode 12 according to the second embodiment, so the same reference numerals are given to the same elements, and overlapping description will be omitted.

As exemplified by the present embodiment, the part 72 of the protective film 70 embedded in the outer peripheral trench 61 may not necessarily contact the insulating film 63.

Figure 14:
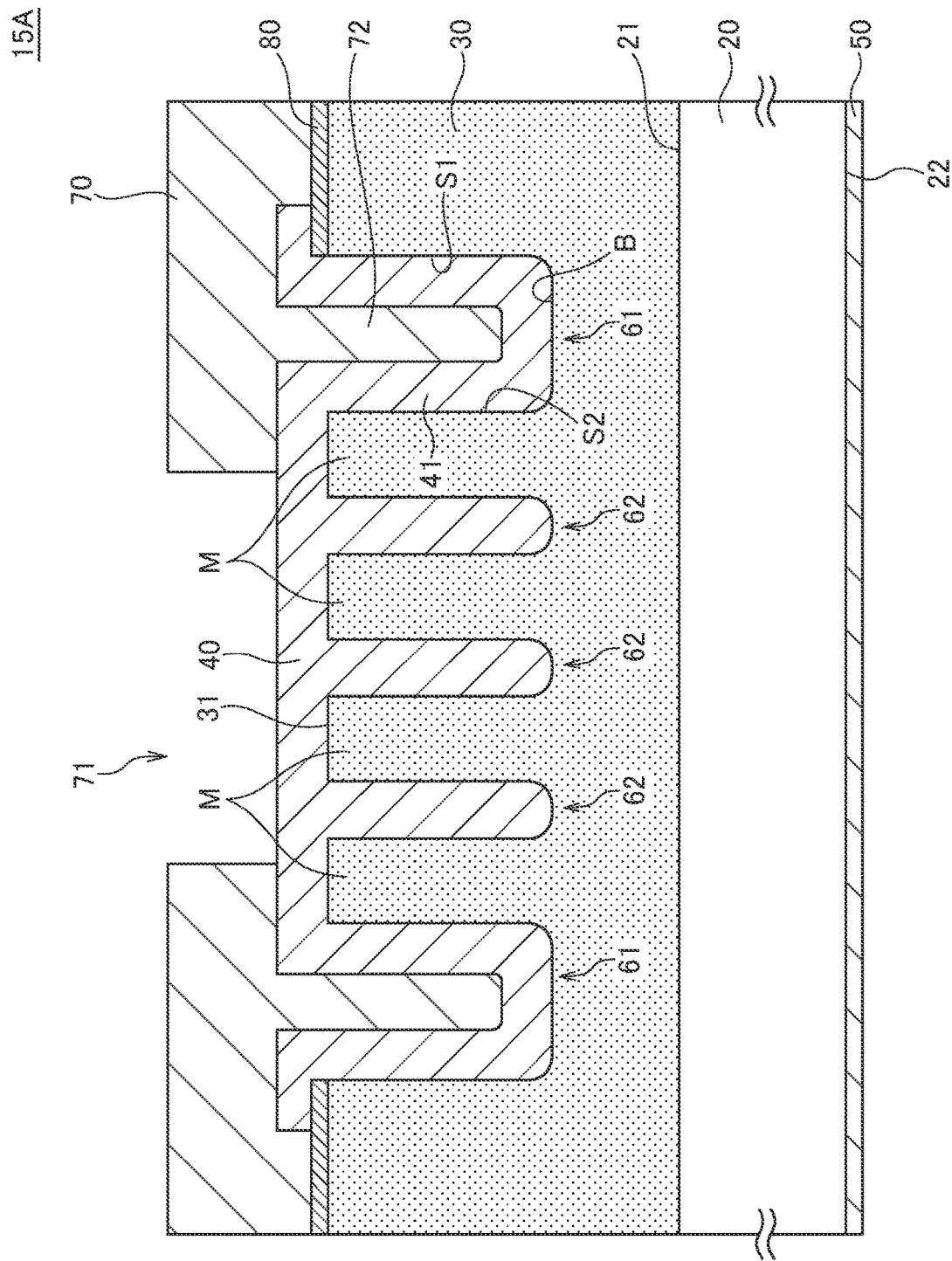
FIG. 14 is a schematic plan view illustrating the configuration of a Schottky barrier diode 15A according to a modification of the fifth embodiment.

FIG. 14 is a schematic cross-sectional view illustrating the configuration of a Schottky barrier diode 15A according to a modification of the fifth embodiment.

As illustrated in FIG. 14, the Schottky barrier diode 15A according to the fifth embodiment differs from the Schottky barrier diode 15 according to the fifth embodiment in that the outer peripheral portion of the anode electrode 40 is positioned on the drift layer 30 with a field insulating film 80 interposed therebetween. Other basic configurations are the same as those of the Schottky barrier diode 15 according to the fifth embodiment, so the same reference numerals are given to the same elements, and overlapping description will be omitted.

As exemplified by the present modification, when the outer peripheral portion of the anode electrode 40 and the drift layer 30 overlap each other, the field insulating film 80 is interposed therebetween, whereby the concentration of an electric field can be relaxed. As the material of the field insulating film 80, $SiO_2$ or the like may be used.

Sixth Embodiment

Figure 15:
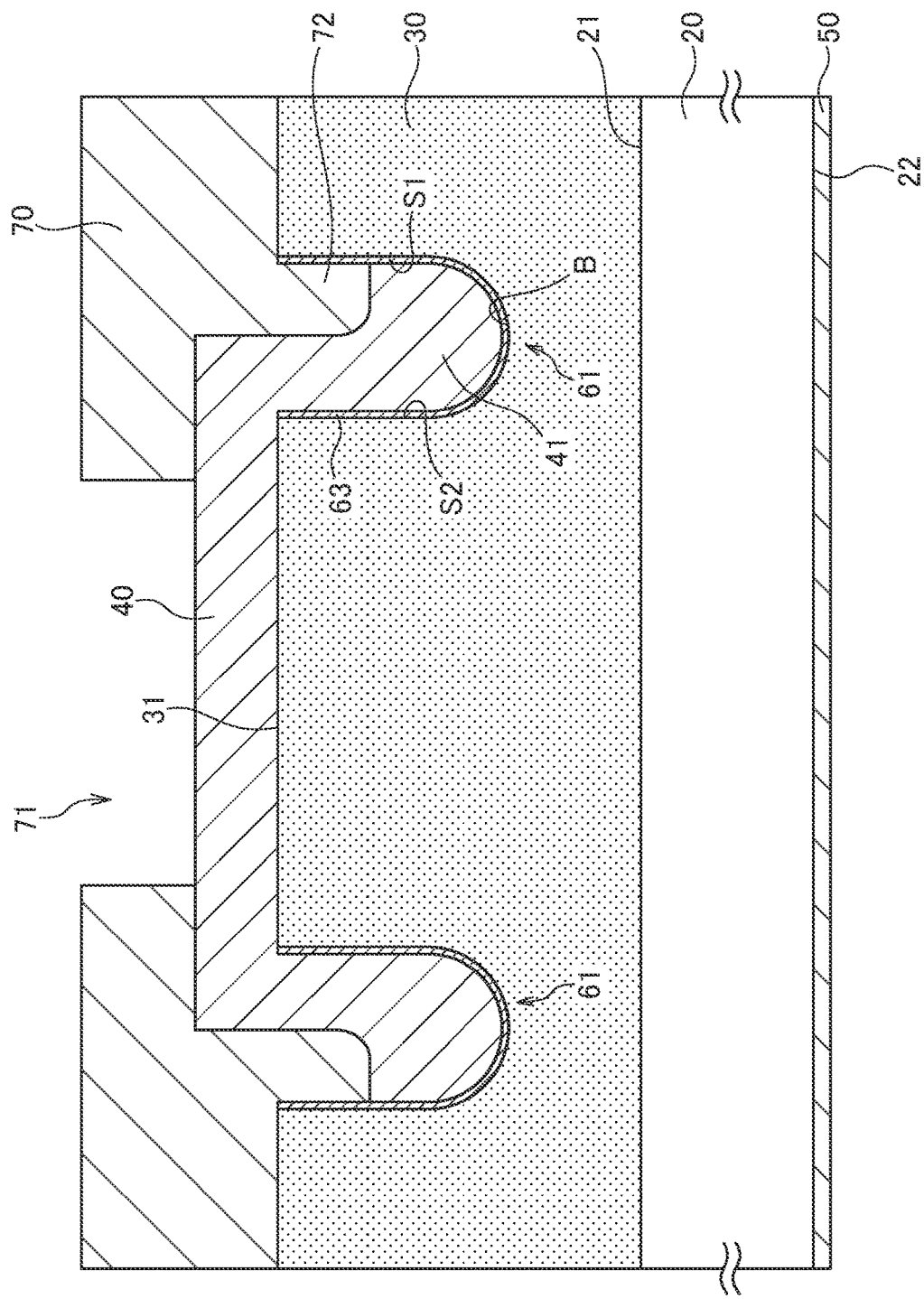
FIG. 15 is a schematic plan view illustrating the configuration of a Schottky barrier diode 16 according to a sixth embodiment of the present invention.

FIG. 15 is a schematic cross-sectional view illustrating the configuration of a Schottky barrier diode 16 according to a sixth embodiment of the present invention.

As illustrated in FIG. 15, the Schottky barrier diode 16 according to the sixth embodiment differs from the Schottky barrier diode 11 according to the first embodiment in that the bottom surface part B of the outer peripheral trench 61 is not flat but curved as a whole. Other basic configurations are the same as those of the Schottky barrier diode 11 according to the first embodiment, so the same reference numerals are given to the same elements, and overlapping description will be omitted.

Even when the bottom surface part B of the outer peripheral trench 61 is curved as a whole, it is possible to relax an electric field applied to the drift layer 30 in the vicinity of the end portion of the metal member 41 as in the Schottky barrier diode 11 according to the first embodiment as long as the boundary between the part 72 of the protective film 70 and the metal member 41 terminates at the flat side wall part S1 of the outer peripheral trench 61 in which they are embedded.

Seventh Embodiment

Figure 16:
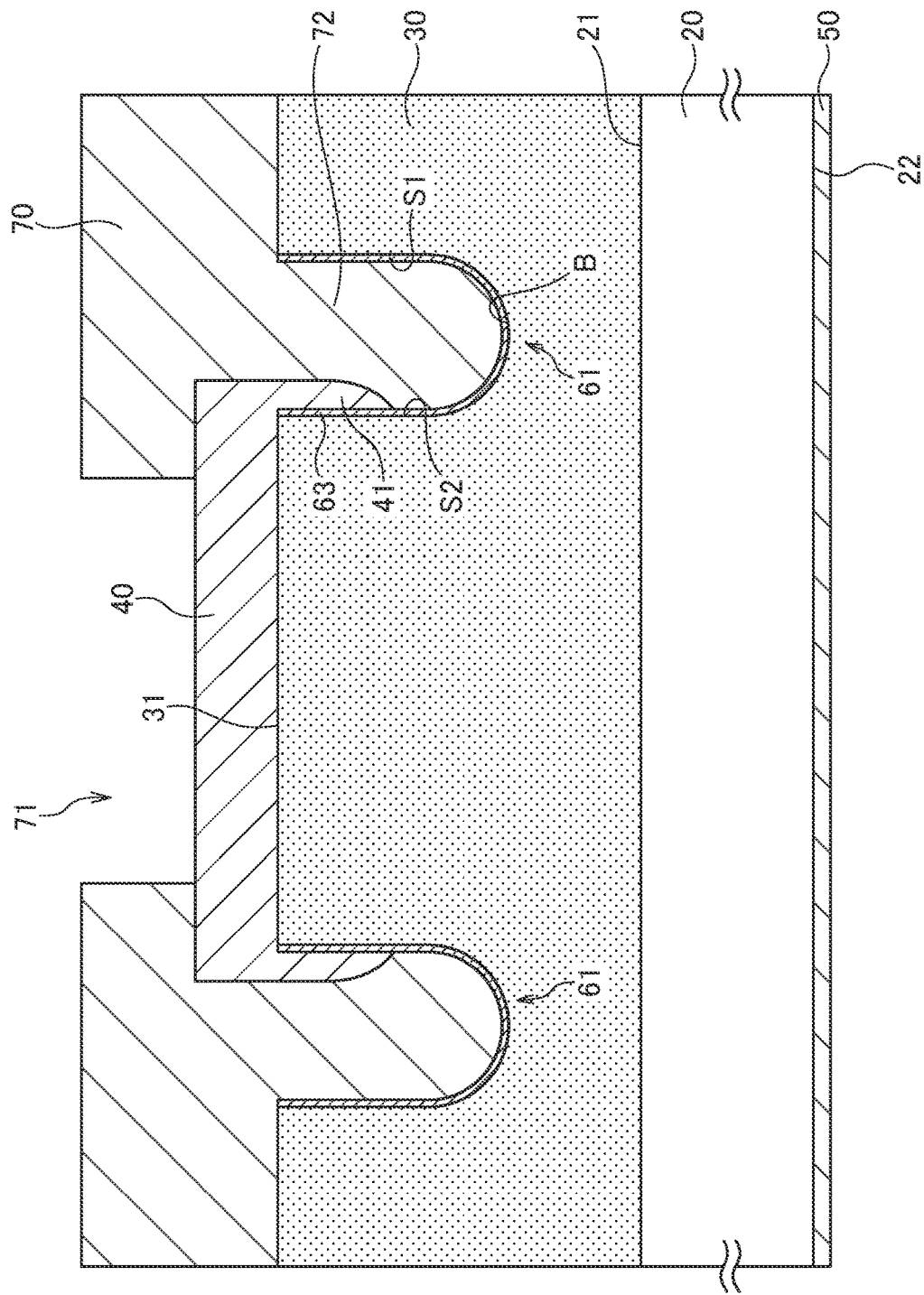
FIG. 16 is a schematic plan view illustrating the configuration of a Schottky barrier diode 17 according to a seventh embodiment of the present invention.

FIG. 16 is a schematic cross-sectional view illustrating the configuration of a Schottky barrier diode 17 according to a seventh embodiment of the present invention.

As illustrated in FIG. 16, the Schottky barrier diode 17 according to the seven embodiment differs from the Schottky barrier diode 16 according to the sixth embodiment in that the boundary between the part 72 of the protective film 70 and the metal member 41 terminates at the inner side wall part S2 of the outer peripheral trench 61 in which they are embedded. Other basic configurations are the same as those of the Schottky barrier diode 16 according to the sixth embodiment, so the same reference numerals are given to the same elements, and overlapping description will be omitted.

Even when the bottom surface part B of the outer peripheral trench 61 is curved as a whole, it is possible to relax an electric field applied to the drift layer 30 in the vicinity of the end portion of the metal member 41 as in the Schottky barrier diode 11 according to the first embodiment as long as the boundary between the part 72 of the protective film 70 and the metal member 41 terminates at the flat side wall part S2 of the outer peripheral trench 61 in which they are embedded.

While the preferred embodiments of the present invention have been described, the present invention is not limited to the above embodiments, and various modifications may be made within the scope of the present invention, and all such modifications are included in the present invention.

EXAMPLES

Example 1

A simulation model of Example 1 having the same configuration as the Schottky barrier diode 12 illustrated in FIG. 10 was assumed, and electric field strength was simulated with an 800 V reverse voltage applied between the anode electrode 40 and the cathode electrode 50. The dopant concentration of the semiconductor substrate 20 was set to $1 \times 10^{18}$ cm$^{-3}$, and the dopant concentration of the drift layer 30 was to $2 \times 10^{16}$ cm$^{-3}$. The thickness of the drift layer 30 was set to 7 µm. The width W1 of the outer peripheral trench 61 was set to 10 µm, the width of the center trench was to 2 µm, and the depths of the trenches 61 and 62 were to 3 µm. Further, the width of a part of the drift layer 30 that contacts the anode electrode 40, i.e., the width of the mesa region M was set to 2 µm. The insulating film 63 was an HfO$_2$ film having a thickness of 50 nm. As the material of the protective film 70, SiN was used.

Then, electric field strength applied to the corner part C was simulated with a depth position x of the boundary between the part 72 of the protective film 70 and the metal member 41 changed from 0 µm to 3 µm. The depth position x refers to, as illustrated in FIG. 10, the boundary position between the part 72 of the protective film 70 and the metal member 41 from the bottom portion of the outer peripheral trench 61. The simulation result is illustrated in FIG. 17.

Figure 17:
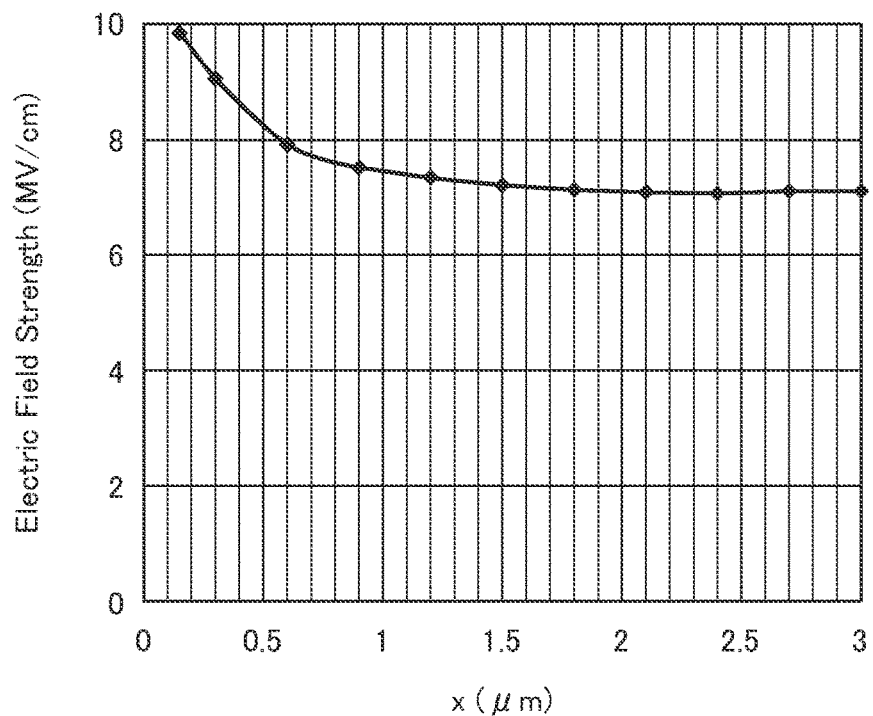
FIG. 17 is a graph showing a simulation result of an Example 1.

As illustrated in FIG. 17, when the depth position x is 0.9 µm or more, the electric field strength applied to the corner part C sufficiently falls below 8 MV/cm which is the dielectric breakdown electric field strength of gallium oxide. However, when the depth position x is 3.0 µm, i.e., when the protective film 70 is not embedded in the outer peripheral trench 61 at all, adhesion enhancing effect cannot be obtained, and peeling is more likely to occur. On the other hand, when the depth position x is 0.6 µm or less, the electric field strength applied to the corner part C becomes 8 MV/cm or more. This is considered because when the depth position x is too small, the boundary between the part 72 of the protective film 70 and the metal member 41 terminates at the curved surface of the corner part C.

Example 2

A simulation model of Example 2 having the same configuration as the Schottky barrier diode 13 illustrated in FIG. 11 was assumed, and electric field strength was simulated with an 800 V reverse voltage applied between the anode electrode 40 and the cathode electrode 50. The simulation model of Example 2 was different from the simulation model of Example 1 in that the boundary between the part 72 of the protective film 70 and the metal member 41 terminates at the bottom surface part B. The parameters in the simulation model of Example 2 were the same as those in the simulation model of Example 1.

Then, electric field strength applied to the corner part C was simulated with a plane position x of the boundary between the part 72 of the protective film 70 and the metal member 41 changed from 0 µm to 10 µm. The plane position x refers to, as illustrated in FIG. 11, the boundary position between the part 72 of the protective film 70 and the metal member 41 from the side wall part S2 of the outer peripheral trench 61. The simulation result is illustrated in FIG. 18.

Figure 18:
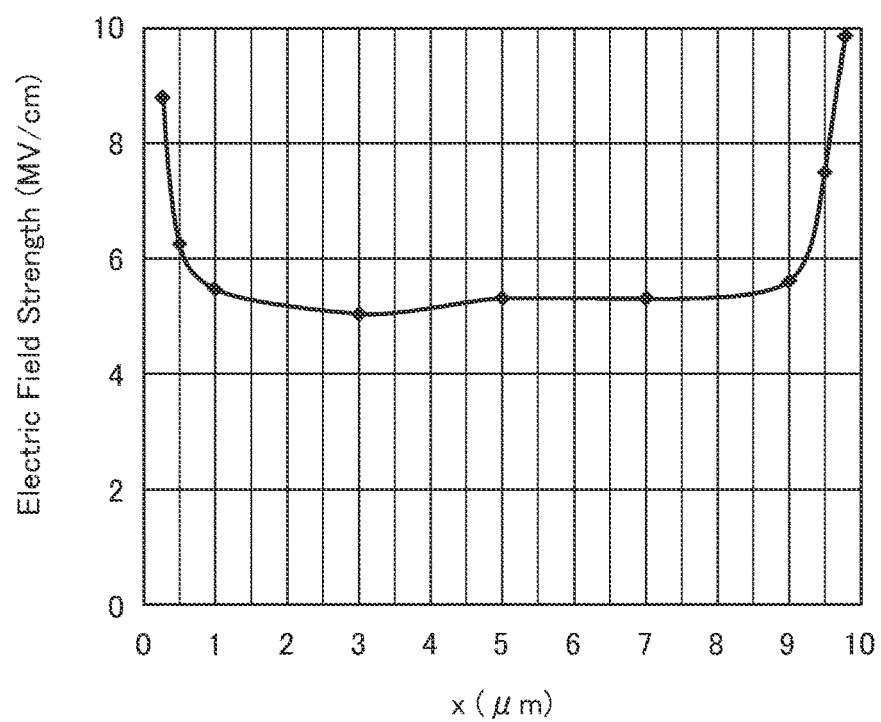
FIG. 18 is a graph showing a simulation result of an Example 2.

As illustrated in FIG. 18, when the plane position x falls within the range of 0.5 µm to 9.5 µm, electric field strength applied to the corner part C sufficiently falls below 8 MV/cm which is the dielectric breakdown electric field strength of gallium oxide. On the other hand, when the plane position x becomes close to 0 µm or 10 µm, the electric field strength applied to the corner part C becomes 8 MV/cm or more. This is considered because when the plane position x is too small or too large, the boundary between the part 72 of the protective film 70 and the metal member 41 terminates at the curved surface of the corner part C.

Example 3

A simulation model of Example 3 having the same configuration as the Schottky barrier diode 14 illustrated in FIG. 12 was assumed, and electric field strength was simulated with an 800 V reverse voltage applied between the anode electrode 40 and the cathode electrode 50. The simulation model of Example 3 was different from the simulation model of Example 1 in that the boundary between the part 72 of the protective film 70 and the metal member 41 terminates at the side wall part S2. The parameters in the simulation model of Example 3 were the same as those in the simulation model of Example 1.

Then, electric field strength applied to the corner part C was simulated with a depth position x of the boundary between the part 72 of the protective film 70 and metal member 41 changed from 0 µm to 3 µm. The depth position x refers to, as illustrated in FIG. 12, the boundary position between the part 72 of the protective film 70 and the metal member 41 from the bottom portion of the outer peripheral trench 61. The simulation result is illustrated in FIG. 19.

Figure 19:
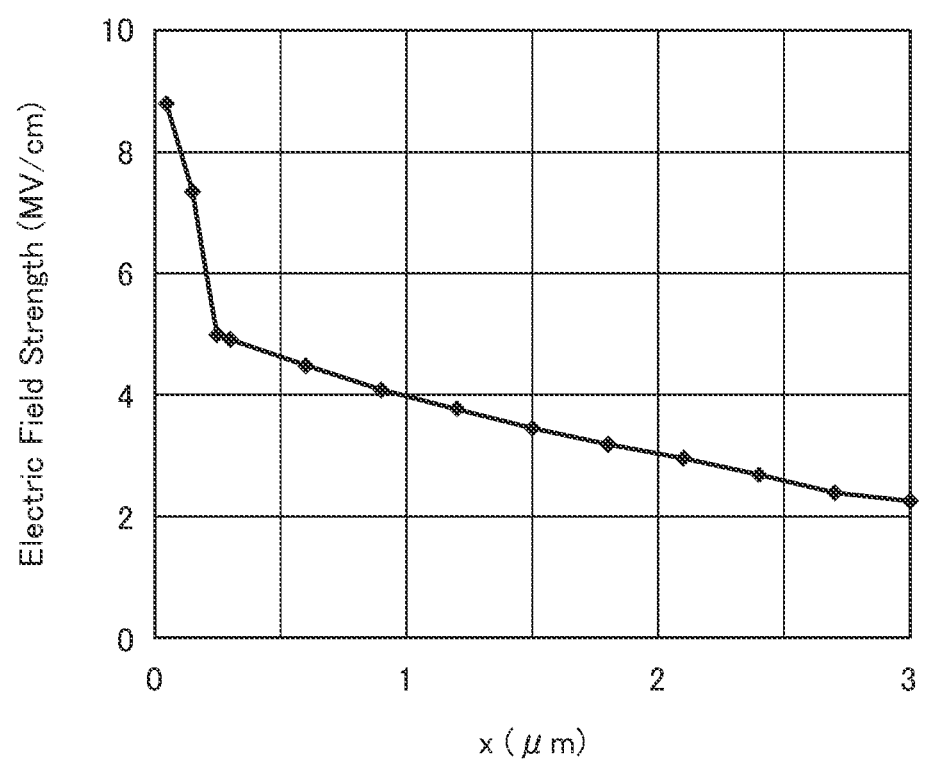
FIG. 19 is a graph showing a simulation result of an Example 3.

As illustrated in FIG. 19, when the depth position x is 0.2 µm or more, the electric field strength applied to the corner part C sufficiently falls below 8 MV/cm which is the dielectric breakdown electric field strength of gallium oxide. However, when the depth position x becomes close to 0 µm, electric field strength applied to the corner part C becomes 8 MV/cm or more. This is considered because when the depth position x is too small, the boundary between the part 72 of the protective film 70 and the metal member 41 terminates at the curved surface of the corner part C.

REFERENCE SIGNS LIST

11-17, 15A Schottky barrier diode
20 semiconductor substrate
21 upper surface of semiconductor substrate
22 back surface of semiconductor substrate
30 drift layer
31 upper surface of the drift layer
40 anode electrode
41 metal member
42 cavity
50 cathode electrode
61 outer peripheral trench
62 center trench
63 insulating film
70 protective film
71 opening
72 part of protective film
80 field insulating film
B bottom surface part
C corner part
E0-E2 edge
M mesa region
R resist
S1, S2 side wall part

What is claimed is:

1. A Schottky barrier diode comprising:
a semiconductor substrate made of gallium oxide;
a drift layer made of gallium oxide and formed on the semiconductor substrate;
an anode electrode brought into Schottky contact with the drift layer;
a cathode electrode brought into ohmic contact with the semiconductor substrate;
an insulating film covering an inner wall of a trench formed in the drift layer; and
a protective film covering the anode electrode,
wherein the trench is filled with a part of the protective film and a metal member such that a first sidewall of the trench, the insulating film, the part of the protective film, the metal member, the insulating film, and a second sidewall of the trench are sequentially arranged in this order without intervening elements.

2. The Schottky barrier diode as claimed in claim 1, wherein the trench is formed in a ring shape and filled with the part of the protective film and the metal member electrically connected to the anode electrode.

3. The Schottky barrier diode as claimed in claim 2, wherein the first sidewall has a flat side wall part, and wherein a boundary between the protective film and the metal member ends at the side wall part.

4. The Schottky barrier diode as claimed in claim 2, wherein the trench has a flat bottom surface part, and wherein a boundary between the protective film and the metal member ends at the bottom surface part.

5. The Schottky barrier diode as claimed in claim 1, wherein a boundary between the part of the protective film and the metal member meets a portion of the first sidewall of the trench that is located below a topmost edge of the trench.

6. The Schottky barrier diode as claimed in claim 1, wherein a boundary between the part of the protective film and the metal member meets a portion of a bottom of the trench.

* * * * *